United States Patent
Kwack et al.

(10) Patent No.: US 9,496,518 B2
(45) Date of Patent: *Nov. 15, 2016

(54) ORGANIC LIGHT-EMITTING DISPLAY APPARATUS AND METHOD OF MANUFACTURING SAME

(71) Applicant: Samsung Display Co., Ltd, Yongin, Gyeonggi-Do (KR)

(72) Inventors: Jin-Ho Kwack, Yongin (KR); Tae-Wook Kang, Yongin (KR); Dae-Beom Shin, Yongin (KR); Dong-Won Han, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,859

(22) Filed: Jul. 7, 2014

(65) Prior Publication Data
US 2015/0048331 A1 Feb. 19, 2015

(30) Foreign Application Priority Data
Aug. 14, 2013 (KR) .......... 10-2013-0096886

(51) Int. Cl.
| | |
|---|---|
| *H01L 51/52* | (2006.01) |
| *H01L 51/00* | (2006.01) |
| *H01L 27/32* | (2006.01) |
| *H01L 29/08* | (2006.01) |
| *H01L 51/56* | (2006.01) |
| *H01L 27/00* | (2006.01) |

(52) U.S. Cl.
CPC ........... *H01L 51/5253* (2013.01); *H01L 27/32* (2013.01); *H01L 29/08* (2013.01); *H01L 51/5246* (2013.01); *H01L 51/56* (2013.01); *H01L 27/00* (2013.01); *H01L 51/00* (2013.01)

(58) Field of Classification Search
CPC ........... H01L 51/5253; H01L 51/5246; H01L 51/56; H01L 51/00; H01L 27/00; H01L 27/32; H01L 29/08
USPC ................ 257/40, 59, 72, 88, 100, E51.018, 257/E51.02, E51.022, E51.026, E21.412, 257/E21.414, E29.289, E29.294, E33.053, 257/E33.059; 313/493, 504, 512; 438/28, 438/29, 34; 445/58
See application file for complete search history.

(56) References Cited

U.S. PATENT DOCUMENTS

| | | | |
|---|---|---|---|
| 8,598,786 B1* | 12/2013 | Kim ..................... | H01L 51/5253 257/40 |
| 8,772,824 B2* | 7/2014 | Lee et al. ....................... | 257/100 |
| 9,281,499 B2* | 3/2016 | Shin ....................... | H01L 51/524 |

(Continued)

FOREIGN PATENT DOCUMENTS

| | | |
|---|---|---|
| KR | 10-2004-0015360 A | 2/2004 |
| KR | 10-2009-0045847 | 5/2009 |

(Continued)

*Primary Examiner* — Dao H Nguyen
(74) *Attorney, Agent, or Firm* — Innovation Counsel LLP (57) ABSTRACT

An organic light-emitting display apparatus includes a substrate; a display unit which defines an active area on the substrate and includes a thin film transistor and an organic light-emitting device electrically connected to each other; and an encapsulation layer disposed on a top surface and a side surface of the display unit, the encapsulation layer including at least a first inorganic layer, a first organic layer, and a second inorganic layer that are sequentially stacked, and the first organic layer covers the first inorganic layer.

19 Claims, 4 Drawing Sheets

(56) References Cited

U.S. PATENT DOCUMENTS

| | | | |
|---|---|---|---|
| 2003/0164674 A1* | 9/2003 | Imamura | H05B 33/04 313/493 |
| 2007/0114521 A1* | 5/2007 | Hayashi | H01L 51/5237 257/40 |
| 2009/0115321 A1* | 5/2009 | Hayashi | 313/504 |
| 2010/0200846 A1 | 8/2010 | Kwack et al. | |
| 2011/0163330 A1* | 7/2011 | Kim | H01L 51/5256 257/88 |
| 2012/0091477 A1* | 4/2012 | Kim | H01L 51/5246 257/88 |
| 2012/0146492 A1* | 6/2012 | Ryu et al. | 313/512 |
| 2015/0021565 A1 | 1/2015 | Min et al. | |
| 2015/0228701 A1* | 8/2015 | Oh | H01L 51/5253 257/40 |

FOREIGN PATENT DOCUMENTS

| | | |
|---|---|---|
| KR | 10-2010-0090888 A | 8/2010 |
| KR | 10-2012-0040480 | 4/2012 |
| KR | 1020150011231 | 1/2015 |

\* cited by examiner

ORGANIC LIGHT-EMITTING DISPLAY APPARATUS AND METHOD OF MANUFACTURING SAME

RELATED APPLICATIONS

This application claims the benefit of Korean Patent Application No. 10-2013-0096886, filed on Aug. 14, 2013, in the Korean Intellectual Property Office, the disclosure of which is incorporated herein in its entirety by reference.

BACKGROUND

1. Field

One or more embodiments of the present invention relate to an organic light-emitting display apparatus and a method of manufacturing the same.

2. Description of the Related Art

An organic light-emitting display apparatus is a self-emission type display apparatus including an organic light-emitting device. An organic light-emitting device includes a hole injection electrode, an electron injection electrode, and an organic emission layer formed therebetween. An organic light-emitting device emits light when excitons drop from an excited state to a ground state, the excitons being generated when holes injected from the hole injection electrode and electrons injected from the electron injection electrode are bonded in the organic emission layer.

Because the organic light-emitting display apparatus is a self-emission type display apparatus, it does not need a separate light source. As a result, the organic light-emitting display apparatus may be driven at a low voltage, and may be formed to be lightweight and thin. Such devices have attracted attention as a next-generation display apparatus due to high-grade characteristics, such as wide angle of views, high contrast, quick response speeds, and the like. However, organic light-emitting devices have a disadvantage of being susceptible to deterioration due to external humidity, oxygen, and/or the like, and as a result, the organic light-emitting device is sealed up to protect the organic light-emitting device from the external humidity, oxygen, and/or the like.

Recently, to make the organic light-emitting display apparatus thinner and/or flexible, a thin film encapsulation (TFE), which includes a plurality of inorganic layers or a plurality of layers including an organic layer and an inorganic layer, has been used as a means for sealing up to the organic light-emitting device.

As the inorganic layer in a TFE are made thicker, intrusion of external humidity, oxygen, and/or the like may be more effectively prevented. However, when the thickness of the inorganic layer increases, a film stress of the inorganic layer also increases, and accordingly, the inorganic layer may be peeled off. If the organic layer is peeled off, external humidity, oxygen, and/or the like may intrude into the organic light-emitting device, thereby resulting in a decrease in the life span of the organic light-emitting display apparatus.

SUMMARY

An organic light-emitting display apparatus having an improved sealing force of a thin film encapsulation (TFE) layer and a method of manufacturing the same are provided.

Additional aspects will be set forth in part in the description which follows and, in part, will be apparent from the description, or may be learned by practice of the presented embodiments.

An organic light-emitting display apparatus includes: a substrate; a display unit which defines an active area on the substrate, the display unit including a thin film transistor and an organic light-emitting device electrically connected to each other; and an encapsulation layer disposed on a tope surface and a side surface of the display unit, the encapsulation layer including at least a first inorganic layer, a first organic layer, and a second inorganic layer that are sequentially stacked, wherein the first organic layer covers the first inorganic layer.

The encapsulation layer may further include: a second organic layer formed on the second inorganic layer; and a third inorganic layer formed on the second organic layer, wherein the third inorganic layer may contact an upper surface of the second inorganic layer outside the active area.

The second inorganic layer and the third inorganic layer may be formed of a same material.

The thin film transistor may include an active layer, a gate electrode, a source electrode, a drain electrode, and an interlayer insulating layer disposed between the gate electrode and the source electrode and between the gate electrode and the drain electrode, and the second inorganic layer may directly contact the interlayer insulating layer outside the active area.

The second inorganic layer and the interlayer insulating layer may be formed of a same material.

The organic light-emitting device may include: a pixel electrode connected to any one of the source electrode and the drain electrode; an intermediate layer which is disposed on the pixel electrode and includes an organic emission layer; and an opposite electrode disposed on the intermediate layer, wherein the first inorganic layer is disposed on the opposite electrode.

The organic light-emitting display apparatus may further include a protective layer disposed between the opposite electrode and the first inorganic layer.

The protective layer may include: a capping layer which covers the opposite electrode; and a blocking layer on the capping layer.

The first inorganic layer and the second inorganic layer may be formed of different materials from each other.

The first inorganic layer may include an aluminum oxide ($AlO_x$).

The second inorganic layer may include a silicon nitride ($SiN_x$).

A method of manufacturing an organic light-emitting display apparatus includes: forming a display unit which defines an active area on the substrate; forming a first inorganic layer on the display unit; forming a first organic layer to cover the first inorganic layer; and forming a second inorganic layer to surround the first organic layer.

The method may further include forming a protective layer on the display unit.

The forming of the protective layer may include: forming a capping layer on the display unit; and forming a blocking layer on the capping layer.

The first inorganic layer may be formed by a sputtering method and formed of an aluminum oxide ($AlO_x$).

The display unit may include an interlayer insulating layer extending outside the active area, and the second inorganic layer may be formed to contact an upper surface of the interlayer insulating layer outside the active area.

The second inorganic layer and the interlayer insulating layer may be formed of a same material.

The method may further include: forming a second organic layer on the second inorganic layer; and forming a third inorganic layer on the second organic layer, wherein the second inorganic layer and the third inorganic layer are formed by chemical vapor deposition (CVD).

The third inorganic layer may be formed to contact an upper surface of the second inorganic layer outside the active area, and the third inorganic layer and the second inorganic layer may be formed of a same material.

The first inorganic layer and the second inorganic layer may be formed of different materials from each other.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Figure 1:
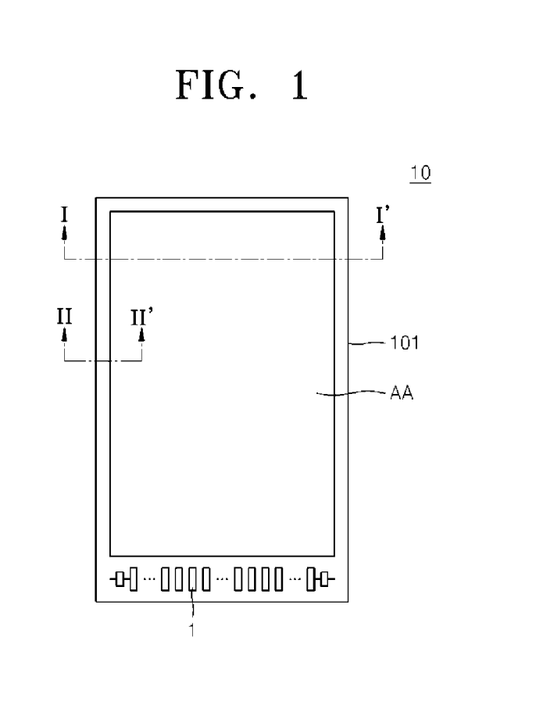
FIG. 1 is a schematic top view of an organic light-emitting display apparatus according to an embodiment.
Figure 2:
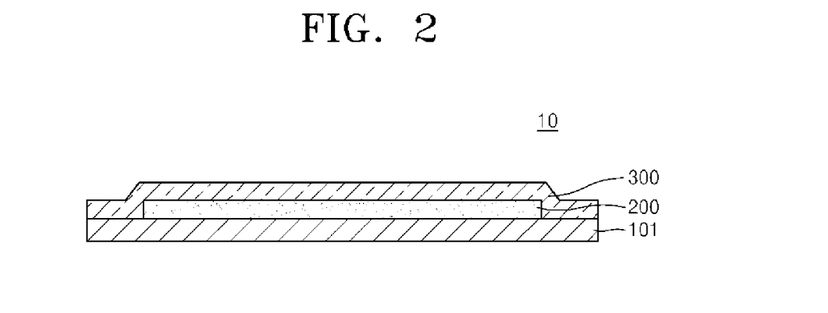
FIG. 2 is a cross-sectional view along line I-I' of the organic light-emitting display apparatus of FIG. 1.
Figure 3:
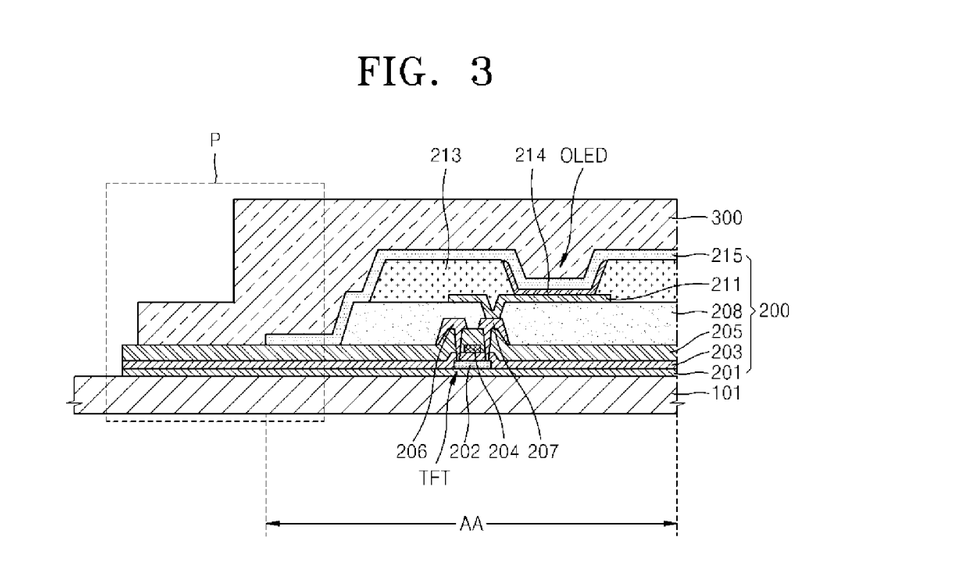
FIG. 3 is a cross-sectional view along line II-II' of the organic light-emitting display apparatus of FIG. 1.
Figure 4:
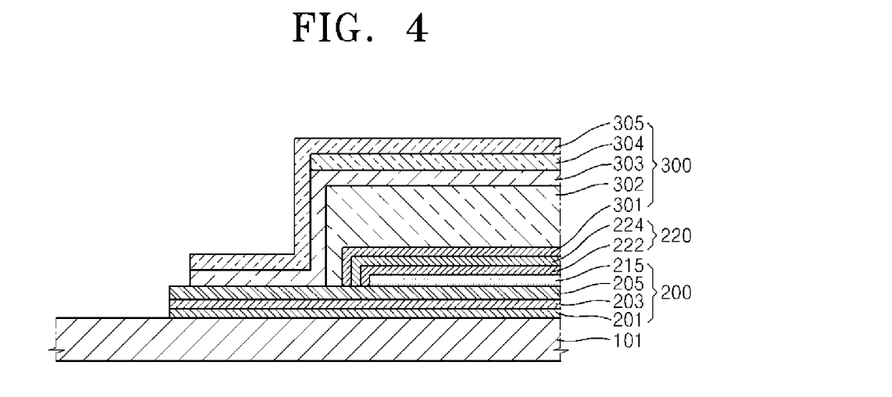
FIG. 4 is a magnified view of a portion P in FIG. 3.

FIG. 1 is a schematic top view of an organic light-emitting display apparatus 10 according to an embodiment, FIG. 2 is a cross-sectional view along line I-I ' of the organic light-emitting display apparatus 10 of FIG. 1, FIG. 3 is a cross-sectional view along line II-II' of the organic light-emitting display apparatus 10 of FIG. 1, and FIG. 4 is a magnified view of a portion P in FIG. 3.

Referring to FIGS. 1 to 4, the organic light-emitting display apparatus 10 according to an embodiment may include a substrate 101, a display unit 200 that defines an active area AA on the substrate 101, and an encapsulation layer 300 that seals up the display unit 200.

The substrate 101 may be a flexible substrate and may be formed of a plastic having good heat resistance and durability, such as, for example, polyimide, polyethylene terephthalate (PET), polycarbonate, polyethylene naphthalate, polyarylate (PAR), polyetherimide, or the like. However, one or more embodiments are not limited thereto, and the substrate 101 may be formed of various materials, such as a metal, glass, and the like.

The display unit 200 defines the active area AA on the substrate 101 and may include a thin film transistor TFT and an organic light-emitting device OLED that are electrically connected to each other. A pad part 1 may be disposed around the active area AA to deliver an electrical signal from a power supply device (not shown) or a signal generation device (not shown) to the active area AA. The display unit 200 will now be described in more detail with reference to FIG. 3.

A buffer layer 201 may be formed on the substrate 101. In this case, the buffer layer 201 is formed on the entire surface of the substrate 101, i.e., in both the active area AA and an area outside of the active area AA. The buffer layer 201 functions to prevent the intrusion of impurity elements through the substrate 101 and provides a planarized plane on the substrate 101. Buffer layer 201 may be formed of various materials for these functions.

For example, the buffer layer 201 may include an inorganic material, such as a silicon oxide, a silicon nitride, a silicon oxynitride, an aluminum oxide, an aluminum nitride, a titanium oxide, a titanium nitride, or the like, or an organic material, such as polyimide, polyesther, acryl, or the like, and may be formed as a stacked body of a plurality of materials from among the materials described above.

The thin film transistor TFT may be formed on the buffer layer 201. The thin film transistor TFT may include an active layer 202, a gate electrode 204, a source electrode 206, and a drain electrode 207.

The active layer 202 may be formed, for example, of an inorganic semiconductor, such as an amorphous silicon or a polysilicon, an organic semiconductor, or an oxide semiconductor and may include a source region, a drain region, and a channel region.

A gate insulating layer 203 may be formed on the active layer 202. In this case, the gate insulating layer 203 is formed on a position that corresponds to the entire surface of the substrate 101. That is, the gate insulating layer 203 is formed on both the active area AA and the area outside of the active area AA. The gate insulating layer 203 insulates the active layer 202 and the gate electrode 204, and may be formed, for example, of an organic material or an inorganic material, such as a silicon nitride ($SiN_x$) or a silicon oxide ($SiO_2$).

The gate electrode 204 may be formed on the gate insulating layer 203. The gate electrode 204 may include, for example, gold (Au), silver, (Ag), copper (Cu), nickel (Ni), platinum (Pt), palladium (Pd), aluminum (Al), molybdenum (Mo), or an alloy, such as an Al:neodymium (Nd) alloy, a Mo:tungsten (W) alloy, or the like. However, the gate electrode 204 is not limited thereto and may be formed of various materials by considering design conditions.

An interlayer insulating layer 205 may be formed on the gate electrode 204. In this case, the interlayer insulating layer 205 is formed at a position that corresponds to the entire surface of the substrate 101. That is, the interlayer insulating layer 205 is formed in both the active area AA and the area outside of the active area AA.

The interlayer insulating layer 205 is disposed between the gate electrode 204 and the source electrode 206 and between the gate electrode 204 and the drain electrode 207 for providing insulation therebetween. The interlayer insulating layer 205 may be formed, for example, of an inorganic material, such as $SiN_x$, $SiO_2$, or the like. In the current embodiment, the interlayer insulating layer 205 may be formed of $SiN_x$ or formed in a two-layer structure including an $SiN_x$ layer and an $SiO_2$ layer. However, when the interlayer insulating layer 205 is formed in a two-layer structure, the upper layer thereof may be formed as the $SiN_x$ layer to provide a bonding force with the encapsulation layer 300.

The source electrode 206 and the drain electrode 207 may be formed on the interlayer insulating layer 205. In this case, the interlayer insulating layer 205 and the gate insulating layer 203 are formed to expose the source region and the drain region of the active layer 202, and the source electrode 206 and the drain electrode 207 are formed to contact the exposed source and drain regions of the active layer 202.

Although FIG. 3 illustrates the thin film transistor TFT of a top-gate type that sequentially includes the active layer 202, the gate electrode 204 and the source and drain electrodes 206 and 207, one or more of the above embodiments are not limited thereto, and the gate electrode 204 may be disposed below the active layer 202.

The thin film transistor TFT is electrically connected to the organic light-emitting device OLED to drive the organic light-emitting device OLED, and is protected by a passivation layer 208 that covers the thin film transistor TFT.

The passivation layer 208 may include an inorganic insulating layer and/or an organic insulating layer. As the inorganic insulating layer, for example, a silicon oxide ($SiO_2$), a silicon nitride ($SiN_x$), a silicon oxynitride (SiON), an aluminum oxide ($Al_2O_3$), a titanium oxide (TiO2), a tantalum oxide ($Ta_2O_5$), a hafnium oxide ($HfO_2$), a zirconium oxide ($ZrO_2$), a barium stannate titanate (BST), a lead zirconate titanate (PZT), or the like may be used, and as the organic insulating layer, for example, a typical general-use polymer (polymethylmethacrylate (PMMA) or polystyrene (PS)), a polymer derivative having a phenol group, an acryl group polymer, an imide group polymer, an aryl ether group polymer, an amide group polymer, a fluorine group polymer, a p-xylene group polymer, a vinyl alcohol group polymer, a blend thereof, or the like may be used. The passivation layer 208 may be formed as a complex stacked body of an inorganic insulating layer and an organic insulating layer.

The organic light-emitting device OLED may be formed on the passivation layer 208 and may include a pixel electrode 211, an intermediate layer 214, and an opposite electrode 215.

The pixel electrode 211 may be formed on the passivation layer 208. For example, the passivation layer 208 may be formed to expose a predetermined region of the drain electrode 207 without covering the entire drain electrode 207, and the pixel electrode 211 may be formed to be connected to the exposed drain electrode 207.

In the current embodiment, the pixel electrode 211 may be a reflective electrode and may include a reflective layer formed of, for example, Ag, Mg, Al, Pt, Pd, Au, Ni, Nd, iridium (Ir), chromium (Cr), a compound thereof, or the like and a transparent or translucent electrode layer formed on the reflective layer. The transparent or translucent electrode layer may include, for example, at least one selected from the group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The opposite electrode 215 disposed so as to face the pixel electrode 211 may be a transparent or translucent electrode and may be formed, for example, of a metal thin film having a small work function, including lithium (Li), calcium (Ca), lithium fluoride (LiF)/Ca, LiF/Al, Al, Ag, magnesium (Mg), or a compound thereof. In addition, an auxiliary electrode layer or a bus electrode may be further formed of a material for forming a transparent electrode, such as an ITO, an IZO, a ZnO, an $In_2O_3$, or the like.

Thus, the opposite electrode 215 may pass light emitted by an organic emission layer included in the intermediate layer 214. That is, light emitted by the organic emission layer may be directly emitted towards the opposite electrode 215, or it may be reflected by the pixel electrode 211 including a reflective electrode and then emitted towards the opposite electrode 215.

However, the flexible display apparatus 10 according to the current embodiment is not limited to a top emission type, and the light emitted by the organic emission layer may be emitted towards the substrate 101 as a bottom emission type. In this case, the pixel electrode 211 may include a transparent or translucent electrode, and the opposite electrode 215 may include a reflective electrode. The flexible display apparatus 10 may be a double-side emission type to emit light in both directions, i.e., to the top and the bottom.

A pixel defining layer 213 may be formed on the pixel electrode 211 and formed of an insulating material. In this case, the pixel defining layer 213 exposes a predetermined region of the pixel electrode 211, and the intermediate layer 214 including the organic emission layer is located in the exposed region.

The organic emission layer may be formed of a low-molecular organic material or a high-molecular organic material, and besides the organic emission layer, the intermediate layer 214 may further selectively include function layers, such as a hole transport layer (HTL), a hole injection layer (HIL), an electron transport layer (ETL), an electron injection layer (EIL), and the like.

The encapsulation layer 300 is disposed on the opposite electrode 215 and covers a top surface and a side surface of the display unit 200 to seal up the display unit 200. The encapsulation layer 300 may include (FIG. 4) at least a first inorganic layer 301, a first organic layer 302, and a second inorganic layer 303. A protective layer 220 may be further formed between the encapsulation layer 300 and the display unit 200.

The protective layer 220 may include a capping layer 222 that covers the opposite electrode 215 and a blocking layer 224 formed on the capping layer 222.

The capping layer 222 may be formed, for example, of an organic material, such as a-neodymium pyrocatechin disulfonate (a-NPD), N,N'-diphenyl-N,N'-bis(1-naphthyl)(1,1'-biphenyl)-4,4'diamine (NPB), N,N-diphenyl-N,N-bis(3-methylphenyl)(1,1-biphenyl)-4,4 diamine (TPD), 4,4',4"-tris (phenyl-m-tolylamino)triphenylamine (m-MTDATA), tris-(8-hydroxyquinolate)aluminum ($Alq_3$), copper phthalocyanine (CuPc), or the like. The capping layer 222 functions to not only protect the organic light-emitting device OLED but also promotes the efficient emission of light generated by the organic light-emitting device OLED.

The blocking layer 224 may be formed, for example, of an inorganic material, such as LiF, $MgF_2$, $CaF_2$, or the like. The blocking layer 224 functions to block plasma and the like used in a process of forming the first inorganic layer 301 from the intrusion into the organic light-emitting device OLED to prevent damage the intermediate layer 214, the opposite electrode 215, and the like. In the current embodiment, the blocking layer 224 may be formed of LiF.

The first inorganic layer 301 is formed on the protective layer 220. The first inorganic layer 301 may be formed of, for example, an aluminum oxide ($AlO_x$).

The first organic layer 302 is formed on the first inorganic layer 301 and may be formed with a predetermined thickness to planarize a level difference resulting from the pixel defining layer 213. The first organic layer 302 may include, for example, any one of epoxy, acrylate, and urethane acrylate.

When the first inorganic layer 301 and the second inorganic layer 303 are formed of materials that are different from each other, a weak bonding force between the first inorganic layer 301 and the second inorganic layer 303 may cause a peeling-off at a contacting portion between the first inorganic layer 301 and the second inorganic layer 303. In the current embodiment, the first organic layer 302 is formed to cover the first inorganic layer 301. Accordingly, there is no contact between the first inorganic layer 301 and the second inorganic layer 303. Thus, a bad contact between the first inorganic layer 301 and the second inorganic layer 303 does not occur, and accordingly, intrusion of external humidity and oxygen may be effectively prevented.

The second inorganic layer 303 is formed to surround the first organic layer 302. The second inorganic layer 303 may be formed of, for example, $SiN_x$ by chemical vapor deposition (CVD).

The second inorganic layer 303 may be formed so as to be larger than the first organic layer 302, and may directly contact the interlayer insulating layer 205 outside the active area AA. In addition, the second inorganic layer 303 may be formed of the same material as the interlayer insulating layer 205. That is, because the second inorganic layer 303 is formed of $SiN_x$, and the interlayer insulating layer 205 is also formed of $SiN_x$ as described above, or because an upper layer of the interlayer insulating layer 205 is formed of $SiN_x$ even though the interlayer insulating layer 205 has a two-layer structure, a bonding force between the second inorganic layer 303 and the interlayer insulating layer 205 may increase. Thus, the second inorganic layer 303 may be prevented from peeling, and accordingly, intrusion of external humidity and oxygen may be effectively blocked.

A second organic layer 304 and a third inorganic layer 305 may be formed on the second inorganic layer 303, and although not shown, a fourth inorganic layer (not shown) formed of $AlO_x$ may be further formed on the outer surface of the encapsulation layer 300.

The second organic layer 304 may include, for example, any one of epoxy, acrylate, and urethane acrylate. The second organic layer 304 alleviates a film stress exerted onto the first inorganic layer 301.

The third inorganic layer 305 covers the second organic layer 304. The third inorganic layer 305 contacts the upper surface of the second inorganic layer 303 outside the active area AA.

The third inorganic layer 305 may be formed of the same material as the second inorganic layer 303. For example, the third inorganic layer 305 may be formed of $SiN_x$. Accordingly, a bonding force between the third inorganic layer 305 and the second inorganic layer 303 may increase, thereby effectively blocking intrusion of external humidity and oxygen.

The encapsulation layer 300 may further include a plurality of additional inorganic layers and a plurality of additional organic layers that are alternately stacked, and the number of stacks of the inorganic layers and the organic layers is not limited.

A protective film (not shown) is attached to the upper surface of the encapsulation layer 300, and if an attachment force of the protective film is strong, the encapsulation layer 300 may also be peeled when the protective film is removed. Thus, a fourth inorganic layer (not shown) formed of AlOx having a weak attachment force to the protective film may be further formed to solve this problem.

Figure 5:
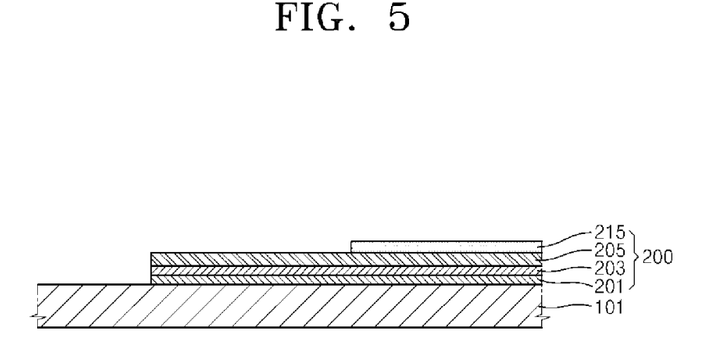
FIGS. 5 to 7 are cross-sectional views schematically illustrating a method of manufacturing the organic light-emitting display apparatus of FIG. 1, according to an embodiment.
Figure 6:
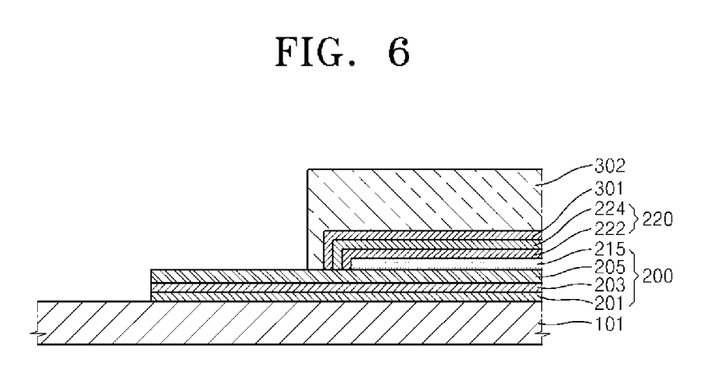
Figure 7:
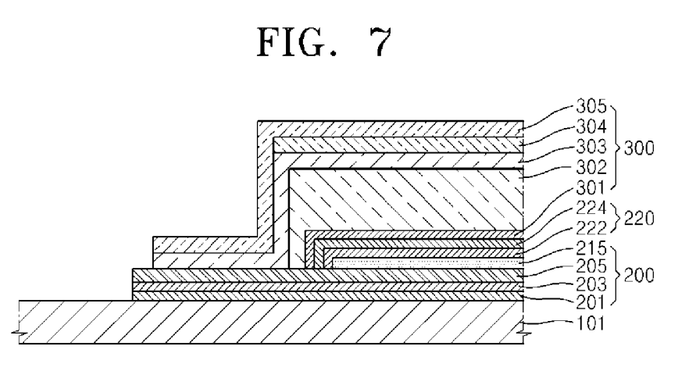

FIGS. 5 to 7 are cross-sectional views schematically illustrating a method of manufacturing the organic light-emitting display apparatus 10 of FIG. 1, according to an embodiment. Because the display unit 200 is the same as described with reference to FIG. 3, the configuration of the display unit 200 is omitted in FIGS. 5 to 7.

The method of manufacturing the organic light-emitting display apparatus 10 will now be described with reference to FIGS. 5 to 7 and FIG. 4 together.

As shown in FIG. 5, the display unit 200 that defines the active area AA is formed on the substrate 101. Because the display unit 200 may have the configuration illustrated in FIG. 3, and various well-known organic light-emitting displays may be applied thereto, a detailed method of manufacturing the display unit 200 is omitted. However, the display unit 200 includes the buffer layer 201 formed over both the active area AA and the area outside of the active area AA, the gate insulating layer 203, and the interlayer insulating layer 205. The interlayer insulating layer 205 is disposed between the gate electrode (204 of FIG. 3) and the source electrode (206 of FIG. 3) and between the gate electrode (204 of FIG. 3) and the drain electrode (207 of FIG. 3) for insulation therebetween and may be formed of an inorganic material, such as $SiN_x$, $SiO_2$, or the like. The interlayer insulating layer 205 may be formed of $SiN_x$ or formed in a two-layer structure of an $SiN_x$ layer and an $SiO_2$ layer. However, when the interlayer insulating layer 205 is formed in a two-layer structure, the upper layer thereof may be formed as an $SiN_x$ layer to provide a bonding force to the second inorganic layer 303.

As shown in FIG. 6, the protective layer 220, the first inorganic layer 301, and the first organic layer 302 are formed on the display unit 200.

The protective layer 220 includes the capping layer 222 which may be formed, for example, of an organic material, such as a-NPD, NPB, TPD, m-MTDATA, $Alq_3$, CuPc, or the like, and the blocking layer 224 which may be formed of LiF. The first inorganic layer 301 may be formed of $AlO_x$. In addition, the first inorganic layer 301 may be formed by a sputtering method.

The first organic layer 302 may be formed with a predetermined thickness to planarize a level difference resulting from the pixel defining layer (213 of FIG. 3). The first organic layer 302 may include any one of epoxy, acrylate, and urethane acrylate. The first organic layer 302 may be formed using a mask having a relatively large opening so that the area of the first organic layer 302 is greater than that of the first inorganic layer 301.

The first organic layer 302 is formed so as to cover the first inorganic layer 301. Accordingly, there is no contact between the first inorganic layer 301 and the second inorganic layer 303. Thus, a malfunction which may occur due to a contact between the first inorganic layer 301 and the second inorganic layer 303 does not occur, and accordingly, the intrusion of external humidity and oxygen may be effectively prevented.

As shown in FIG. 7, the second inorganic layer 303, the second organic layer 304, and the third inorganic layer 305 are sequentially formed.

The second inorganic layer 303 is formed so as to surround the first organic layer 302. The second inorganic layer 303 may be formed of, for example, $SiN_x$ by CVD. Because the second inorganic layer 303 is formed by CVD in which plasma is not used, the first organic layer 302 may not be damaged when the second inorganic layer 303 is formed, thereby preventing a phenomenon that a gas is discharged from the first organic layer 302.

The second inorganic layer 303 is formed to be larger than the first inorganic layer 301 and directly contacts the interlayer insulating layer 205 outside the active area AA. In addition, the second inorganic layer 303 may be formed of the same material as the interlayer insulating layer 205. For example, because the second inorganic layer 303 is formed of $SiN_x$ and the interlayer insulating layer 205 is also formed of $SiN_x$ as described above, or because an upper layer of the interlayer insulating layer 205 is formed of $SiN_x$ even though the interlayer insulating layer 205 has a two-layer structure, a bonding force between the second inorganic layer 303 and the interlayer insulating layer 205 may increase. Thus, the second inorganic layer 303 may be prevented from being peeling, and accordingly, intrusion of external humidity and oxygen may be effectively blocked.

The second organic layer 304 may include, for example, any one of epoxy, acrylate, and urethane acrylate. The second organic layer 304 alleviates a film stress exerted onto the first inorganic layer 301.

The third inorganic layer 305 covers the second organic layer 304. The third inorganic layer 305 may be formed by CVD, thereby not damaging the second organic layer 304.

In addition, the third inorganic layer 305 contacts the upper surface of the second inorganic layer 303 outside the active area AA, and may be formed of the same material as the second inorganic layer 303. For example, the third inorganic layer 305 may be formed of $SiN_x$. Thus, a bonding force between the third inorganic layer 305 and the second inorganic layer 303 may increase, thereby effectively preventing the intrusion of external humidity and oxygen.

The encapsulating layer 300 may further include a plurality of additional inorganic layers and a plurality of additional organic layers that are alternately stacked, and the number of stacks of the inorganic layers and the organic layers is not limited.

As described above, according to the one or more of the above embodiments, an inorganic layer in a TFE layer may be prevented from peeling, thereby effectively blocking intrusion of external humidity, oxygen, and/or the like into the organic light emitting.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure, including the following claims.

What is claimed is:

1. An organic light-emitting display apparatus comprising:
    a substrate;
    a display unit which defines an active area on the substrate, the display unit including a thin film transistor and an organic light-emitting device electrically connected to each other, wherein the thin film transistor comprises an active layer, a gate electrode, a source electrode, a drain electrode, and an interlayer insulating layer disposed between the gate electrode and the source electrode and between the gate electrode and the drain electrode; and
    an encapsulation layer disposed on a top and a side surface of the display unit, the encapsulation layer including at least a first inorganic layer, a first organic layer, and a second inorganic layer that are sequentially stacked,
    wherein the first organic layer covers the first inorganic layer so that at least a region of an edge of the first inorganic layer does not contact the second inorganic layer, and
    wherein the second inorganic layer directly contacts the interlayer insulating layer outside the active area.

2. The organic light-emitting display apparatus of claim 1, wherein the encapsulation layer further comprises:
    a second organic layer formed on the second inorganic layer; and
    a third inorganic layer formed on the second organic layer, wherein the third inorganic layer contacts an upper surface of the second inorganic layer outside the active area.

3. The organic light-emitting display apparatus of claim 2, wherein the second inorganic layer and the third inorganic layer are formed of a same material.

4. The organic light-emitting display apparatus of claim 1, wherein the second inorganic layer and the interlayer insulating layer are formed of a same material.

5. The organic light-emitting display apparatus of claim 1, wherein the organic light-emitting device comprises:
    a pixel electrode connected to any one of the source electrode and the drain electrode;
    an intermediate layer which is disposed on the pixel electrode and includes an organic emission layer; and
    an opposite electrode disposed on the intermediate layer, wherein the first inorganic layer is disposed on the opposite electrode.

6. The organic light-emitting display apparatus of claim 5, further comprising a protective layer disposed between the opposite electrode and the first inorganic layer.

7. The organic light-emitting display apparatus of claim 6, wherein the protective layer comprises:
    a capping layer which covers the opposite electrode; and
    a blocking layer on the capping layer.

8. The organic light-emitting display apparatus of claim 1, wherein the first inorganic layer and the second inorganic layer are formed of different materials from each other.

9. The organic light-emitting display apparatus of claim 8, wherein the first inorganic layer includes an aluminum oxide ($AlO_x$).

10. The organic light-emitting display apparatus of claim 8, wherein the second inorganic layer includes a silicon nitride ($SiN_x$).

11. The organic light-emitting display apparatus of claim 1, wherein the first inorganic layer and the second inorganic layer have different thicknesses.

12. A method of manufacturing an organic light-emitting display apparatus, the method comprising:
    forming a display unit which defines an active area on a substrate, wherein the display unit comprises an interlayer insulating layer extending outside the active area;
    forming a first inorganic layer on the display unit;
    forming a first organic layer to cover the first inorganic layer; and
    forming a second inorganic layer to surround the first organic layer, wherein the second inorganic layer does not contact the first inorganic layer and has a different thickness than the first inorganic layer, and is formed to contact an upper surface of the interlayer insulating layer outside the active area.

13. The method of claim 12, further comprising forming a protective layer on the display unit.

14. The method of claim 13, wherein the forming of the protective layer comprises:
    forming a capping layer on the display unit; and
    forming a blocking layer on the capping layer.

15. The method of claim 14, wherein the first inorganic layer is formed by a sputtering method and formed of an aluminum oxide ($AlO_x$).

16. The method of claim 12, wherein the second inorganic layer and the interlayer insulating layer are formed of a same material.

17. The method of claim 12, further comprising:
forming a second organic layer on the second inorganic layer; and
forming a third inorganic layer on the second organic layer,
wherein the second inorganic layer and the third inorganic layer are formed by chemical vapor deposition (CVD).

18. The method of claim 17, wherein the third inorganic layer is formed to contact an upper surface of the second inorganic layer outside the active area, and the third inorganic layer and the second inorganic layer are formed of a same material.

19. The method of claim 12, wherein the first inorganic layer and the second inorganic layer are formed of different materials from each other.

* * * * *